(12) United States Patent
Mouli

(10) Patent No.: US 9,159,375 B2
(45) Date of Patent: *Oct. 13, 2015

(54) SELECTIVELY CONDUCTING DEVICES, DIODE CONSTRUCTIONS, METHODS OF FORMING DIODES AND METHODS OF CURRENT MODULATION

(71) Applicant: Micron Technology, Inc., Boise, ID (US)

(72) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,123

(22) Filed: Feb. 20, 2015

(65) Prior Publication Data
US 2015/0162053 A1 Jun. 11, 2015

Related U.S. Application Data

(63) Continuation of application No. 12/040,546, filed on Feb. 29, 2008, now Pat. No. 8,987,702, which is a continuation-in-part of application No. 11/743,075, filed on May 1, 2007, now Pat. No. 8,487,450.

(51) Int. Cl.
*H01L 29/861* (2006.01)
*G11C 5/06* (2006.01)
(Continued)

(52) U.S. Cl.
CPC .............. *G11C 5/063* (2013.01); *H01L 21/768* (2013.01); *H01L 24/80* (2013.01);
(Continued)

(58) Field of Classification Search
CPC ............................ H01L 29/861; H01L 29/88
See application file for complete search history.

(56) References Cited

U.S. PATENT DOCUMENTS

| 3,972,059 A | 7/1976 | Distefano |
| 4,068,217 A | 1/1978 | Arnett et al. |

(Continued)

FOREIGN PATENT DOCUMENTS

| EP | 0 660 412 A1 | 12/1994 |
| EP | 1 265 287 A2 | 12/2002 |

(Continued)

OTHER PUBLICATIONS

CN 2009801181514 SR Trans, May 28, 2013, Micron Technology, Inc.

(Continued)

*Primary Examiner* — Allison P Bernstein
(74) *Attorney, Agent, or Firm* — Wells St. John P.S.

(57) ABSTRACT

Some embodiments include selectively conducting devices having a first electrode, a second electrode, and dielectric material between the first and second electrodes. The dielectric material may be configured to conduct current from the first electrode to the second electrode when a first voltage is applied across the first electrode and the second electrode. Furthermore, the dielectric material may be configured to inhibit current from flowing from the second electrode to the first electrode when a second voltage having a polarity opposite that of a polarity of the first voltage is applied across the first electrode and the second electrode. The diode material may comprise a plurality of layers of different dielectric materials arranged in order of increasing barrier height. Quantum wells may form at junctions of layers of the plurality responsive to the first voltage. Some embodiments include diode forming methods.

19 Claims, 10 Drawing Sheets

(51) Int. Cl.
*H01L 21/768* (2006.01)
*H01L 23/00* (2006.01)

(52) U.S. Cl.
CPC ............... *H01L 2924/01013* (2013.01); *H01L 2924/01014* (2013.01); *H01L 2924/01029* (2013.01); *H01L 2924/01042* (2013.01); *H01L 2924/01073* (2013.01); *H01L 2924/01074* (2013.01); *H01L 2924/01078* (2013.01)

(56) References Cited

U.S. PATENT DOCUMENTS

| | | |
|---|---|---|
| 5,497,017 A | 3/1996 | Gonzales |
| 5,512,773 A | 4/1996 | Wolf et al. |
| 6,356,477 B1 | 3/2002 | Tran |
| 6,534,784 B2 | 3/2003 | Eliasson et al. |
| 6,677,207 B1 | 1/2004 | Malone |
| 6,753,561 B1 | 6/2004 | Rinerson et al. |
| 6,756,649 B2 | 6/2004 | Moddel et al. |
| 6,778,421 B2 | 8/2004 | Tran |
| 6,826,079 B2 | 11/2004 | Tran |
| 6,944,052 B2 | 9/2005 | Subramanian et al. |
| 6,961,258 B2 | 11/2005 | Lowrey |
| 6,965,129 B1 | 11/2005 | Horch et al. |
| 6,965,137 B2 | 11/2005 | Kinney et al. |
| 7,035,141 B1 | 4/2006 | Tripsas et al. |
| 7,042,035 B2 | 5/2006 | Rinerson et al. |
| 7,067,862 B2 | 6/2006 | Rinerson et al. |
| 7,071,008 B2 | 7/2006 | Rinerson et al. |
| 7,145,790 B2 | 12/2006 | Kang |
| 7,180,770 B2 | 2/2007 | Perner et al. |
| 7,193,267 B2 | 3/2007 | Hsu et al. |
| 7,220,983 B2 | 5/2007 | Lung et al. |
| 7,320,895 B1 | 1/2008 | Horch et al. |
| 7,388,276 B2 | 6/2008 | Estes |
| 7,400,006 B1 | 7/2008 | Rinerson et al. |
| 7,408,212 B1 | 8/2008 | Luan et al. |
| 7,525,832 B2 | 4/2009 | Muraoka et al. |
| 7,577,022 B2 | 8/2009 | Muraoka et al. |
| 7,706,167 B2 | 4/2010 | Toda |
| 7,719,875 B2 | 5/2010 | Toda |
| 7,755,934 B2 | 7/2010 | Toda |
| 7,858,506 B2 | 12/2010 | Sandhu et al. |
| 7,859,885 B2 | 12/2010 | Toda |
| 8,102,699 B2 | 1/2012 | Toda |
| 8,120,951 B2 | 2/2012 | Mouli |
| 8,134,194 B2 | 3/2012 | Mouli |
| 8,294,219 B2 | 10/2012 | Malhotra et al. |
| 8,502,291 B2 | 8/2013 | Mouli |
| 8,907,318 B2 * | 12/2014 | Sonehara et al. ............... 257/5 |
| 2002/0079524 A1 | 6/2002 | Dennison |
| 2002/0089024 A1 | 7/2002 | Iwata |
| 2002/0196659 A1 | 12/2002 | Hurst et al. |
| 2003/0189851 A1 | 10/2003 | Brandenberger et al. |
| 2003/0203585 A1 | 10/2003 | Hsu |
| 2004/0100817 A1 | 5/2004 | Subramanian et al. |
| 2004/0159828 A1 | 8/2004 | Rinerson et al. |
| 2004/0159867 A1 | 8/2004 | Kinney et al. |
| 2004/0159868 A1 | 8/2004 | Rinerson et al. |
| 2004/0159869 A1 | 8/2004 | Rinerson et al. |
| 2004/0161888 A1 | 8/2004 | Rinerson et al. |
| 2005/0112846 A1 | 5/2005 | Meyer et al. |
| 2005/0128798 A1 | 6/2005 | Kang |
| 2005/0158950 A1 | 7/2005 | Scheuerlein et al. |
| 2005/0207248 A1 | 9/2005 | Hsu |
| 2005/0275106 A1 | 12/2005 | Fricke et al. |
| 2006/0050581 A1 | 3/2006 | Luk et al. |
| 2006/0203541 A1 | 9/2006 | Toda |
| 2006/0249753 A1 | 11/2006 | Herner et al. |
| 2007/0015348 A1 | 1/2007 | Hsu et al. |
| 2007/0069276 A1 | 3/2007 | Scheuerlein et al. |
| 2007/0070690 A1 | 3/2007 | Scheuerlein et al. |
| 2007/0090425 A1 | 4/2007 | Kumar et al. |
| 2007/0221953 A1 | 9/2007 | Sakamoto |
| 2007/0240995 A1 | 10/2007 | Odagawa et al. |
| 2007/0267667 A1 | 11/2007 | Ufert |
| 2007/0285969 A1 | 12/2007 | Toda |
| 2007/0285970 A1 | 12/2007 | Toda |
| 2007/0285971 A1 | 12/2007 | Toda |
| 2008/0112211 A1 | 5/2008 | Toda |
| 2008/0212359 A1 | 9/2008 | Muraoka et al. |
| 2008/0272363 A1 | 11/2008 | Mouli |
| 2008/0273363 A1 | 11/2008 | Mouli |
| 2008/0318397 A1 | 12/2008 | Herner |
| 2009/0967215 | 3/2009 | Muraoka et al. |
| 2009/0242865 A1 | 10/2009 | Lung et al. |
| 2010/0078758 A1* | 4/2010 | Sekar et al. ............... 257/530 |
| 2011/0080778 A1 | 4/2011 | Toda |
| 2012/0099370 A1 | 4/2012 | Toda |

FOREIGN PATENT DOCUMENTS

| | | |
|---|---|---|
| GB | 2 409 336 A | 6/2005 |
| KR | 2005-0058930 | 6/2005 |
| KR | 2005-0110680 | 11/2005 |
| KR | 2008-0005443 | 1/2008 |
| WO | WO 2004/084228 | 9/2004 |
| WO | WO 2006/055482 | 5/2006 |
| WO | WO 2006/114904 | 11/2006 |
| WO | WO 2008/134205 | 11/2008 |

OTHER PUBLICATIONS

EP 08 733 169.0 Search Report, Apr. 6, 2010, Micorn Technology, Inc.
EP 09 75 1110 Sup Search Rept, Jun. 21, 2012, Micron Technology, Inc.
EP 09751113.3 Search Report, May 2, 2011, Micron Technology, Inc.
KR10-20107026077 Search Report, Jun. 17, 2012, Micron Technology, Inc.
PCT/US2008/059661 IPRP, Nov. 3, 2009, Micron Technology, Inc.
PCT/US2008/059661 Search Rept., Jul. 18, 2008, Micron Technology, Inc.
PCT/US2008/059661 Writ. Opin., Jul. 18, 2008, Micron Technology, Inc.
PCT/US2009/035006 IPRP, Aug. 31, 2010, Micron Technology, Inc.
PCT/US2009/035006 Search Rept., Jun. 26, 2009, Micron Technology, Inc.
PCT/US2009/035006 Writ. Opin., Jun. 29, 2009, Micron Technology, Inc.
PCT/US2009/042168 IPRP, Nov. 23, 2010, Micron Technology, Inc.
PCT/US2009/042168 Search Rept., Sep. 30, 2009, Micron Technology, Inc.
PCT/US2009/042168 Writ. Opin., Sep. 30, 2009, Micron Technology, Inc.
PCT/US2009/042236 IPRP, Nov. 23, 2010, Micron Technology, Inc.
PCT/US2009/042236 Search Rept., Dec. 15, 2009, Micron Technology, Inc.
PCT/US2009/042236 Writ. Opin., Dec. 15, 2009, Micron Technology, Inc.
TW 097114674 Search Rept Trans, Aug. 26, 2011, Micron Technology, Inc.
TW 098106558 Search Rept Trans, Mar. 1, 2013, Micron Technology, Inc.
TW 098115904 Search Rept Trans, Feb. 20, 2013, Micron Technology, Inc.
TW 098115926 Search Rept Trans, Sep. 26, 2012, Micron Technology, Inc.
TW 098115926 Search Rept Trans, Jun. 20, 2013, Micron Technology, Inc.
Asamitsu et al., "Current Switching of Resistive States in Magnetoresistive Manganites", Letters to Nature vol. 388, No. 6637, Jul. 3, 1997, United Kingdom, pp. 50-52.
Daughton, "Magnetoresistive Random Access Memory (MRAM)", © Feb. 4, 2000, United States, 13 pages.
Feng, "Evaluation of SiO2 Antifuse in a 3D-OTP Memory", Sep. 3, 2004, IEEE Transactions on Device and Materials Reliability vol. 4, United States, pp. 419-421.

(56) References Cited

OTHER PUBLICATIONS

Hobbs et al., "Fermi-Level Pinning at the Polysilicon/Metal Oxide Interface—Part I", Jun. 6, 2004, IEEE Transactions on Electron Devices vol. 51, United States, pp. 971-977.

Hu et al., "Atomic Layer Deposition of TiO2 from TiI4 and H2O onto SiO2 Surfaces: Ab Initio Calculations of the Initial Reaction Mechanisms", Journal of the American Chemical Society vol. 129, No. 13, Apr. 4, 2007, United States, pp. 3863-3878.

Lee et al., "Two Series Oxide Resistors Applicable to High Speed and High Density Nonvolatile Memory", Advanced Materials vol. 19, No. 22, 2007, Germany, pp. 3919-3923.

National Physical Laboratory, "Kaye & Laby Tables of Physical & Chemical Constants", Chapter 4.3 Work Function, online at http://www.kayelabynpl.co.uk/atomic_and_nuclear_physics/4_3/4_3.html, Oct. 16, 2014, 3 pages.

Strehlow et al., "Compilation of Energy Band Gaps in Elemental and Binary Compound Semiconductors and Insulators", Journal of Physical and Chemical Reference Data vol. 2, No. 1, 1973, United States, pp. 163-199.

Table of Melting Temperatures of Metals, retrieved online at www.engineeringtoolbox.com Mar. 19, 2012, 2 pages.

\* cited by examiner

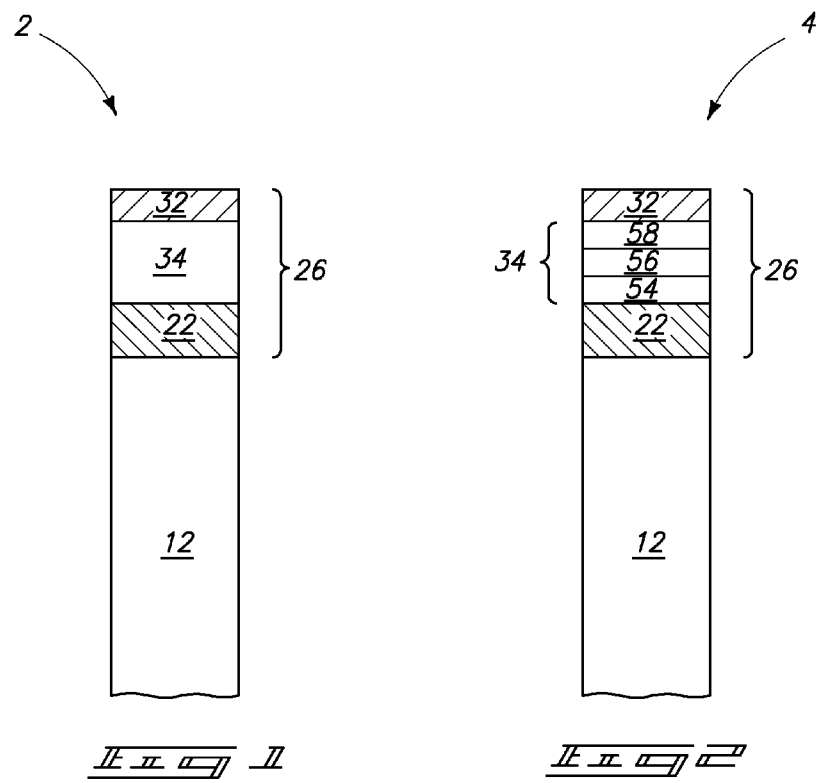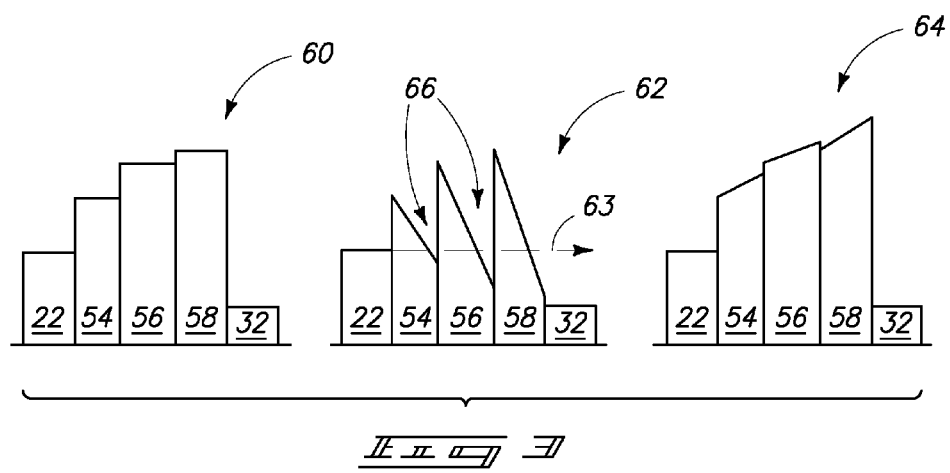

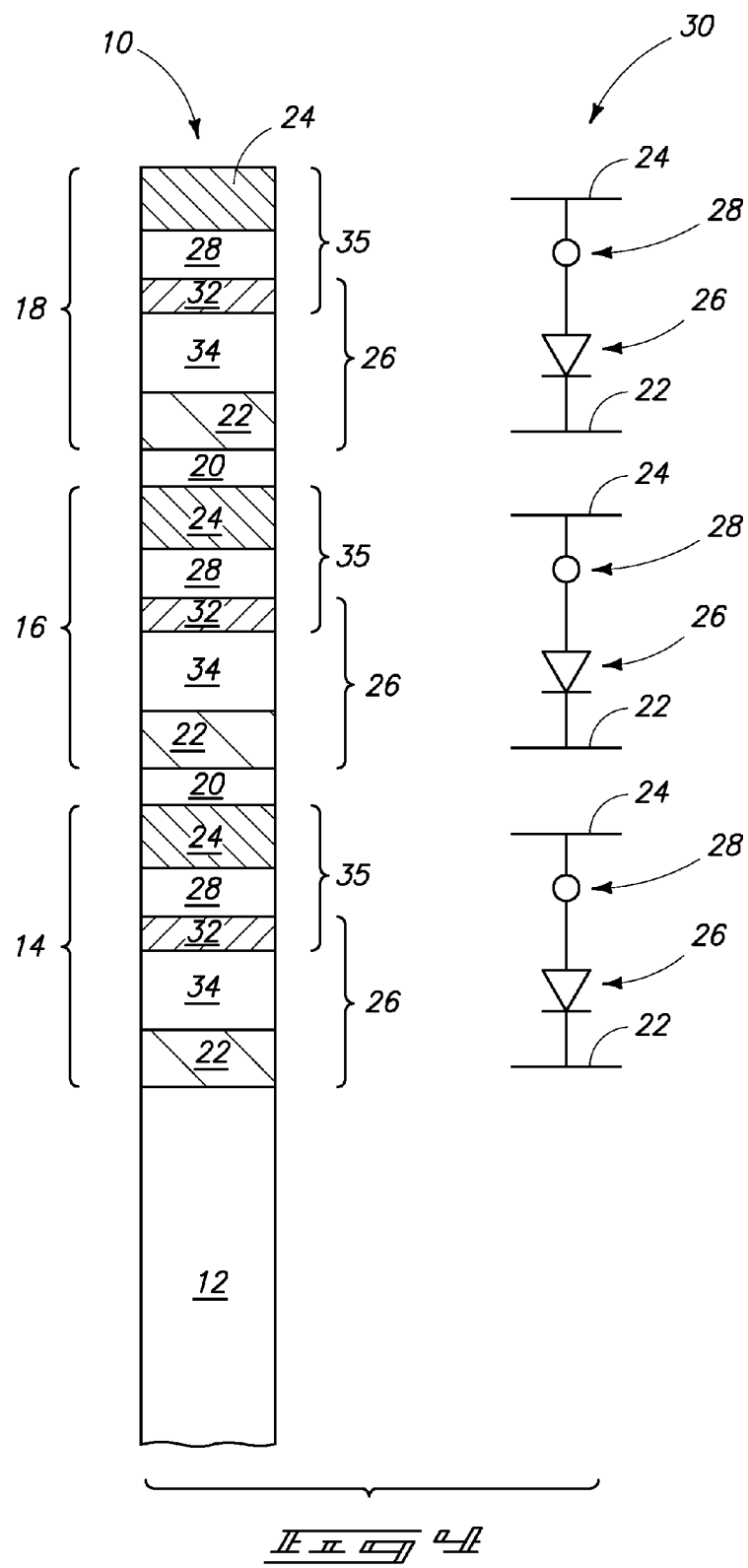

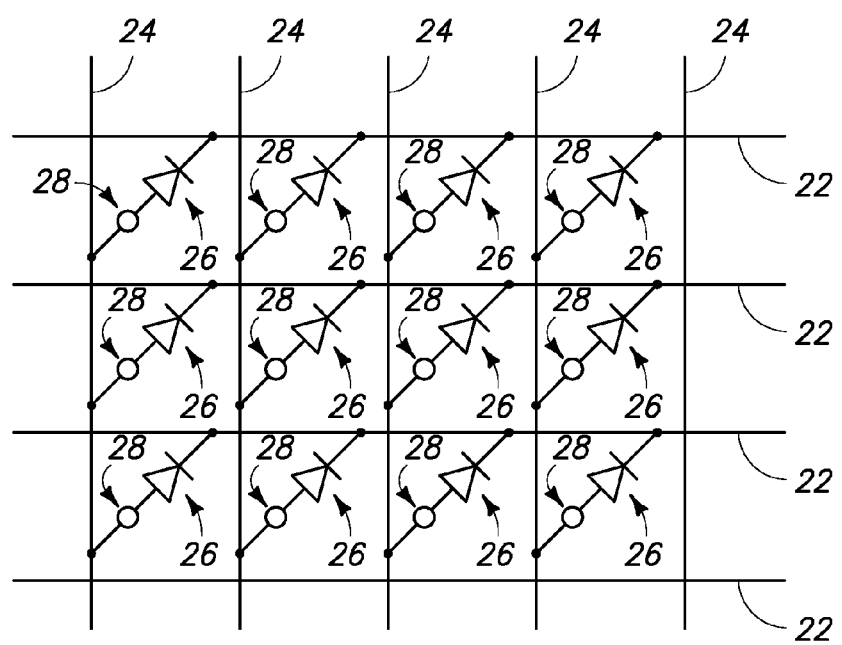
_F I G_ _7_

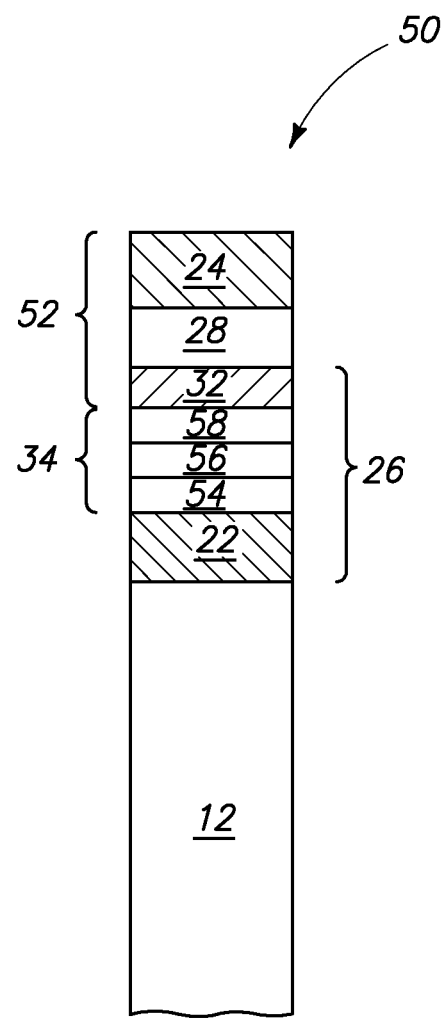

SELECTIVELY CONDUCTING DEVICES, DIODE CONSTRUCTIONS, METHODS OF FORMING DIODES AND METHODS OF CURRENT MODULATION

RELATED PATENT DATA

This patent resulted from a continuation of U.S. patent application Ser. No. 12/040,546 which was filed Feb. 29, 2008, which is a continuation-in-part of U.S. patent application titled "Semiconductor Constructions, Electronic Systems, and Methods of Forming Cross-Point Memory Arrays," filed on 1 May 2007 having Ser. No. 11/743,075, now U.S. Pat. No. 8,487,450, each of which is incorporated by reference herein.

TECHNICAL FIELD

Selectively conducting devices, diode constructions, constructions, and diode forming methods.

BACKGROUND

A continuing goal of integrated circuit fabrication is to decrease the amount of semiconductor real estate consumed by integrated circuit devices, and to thereby increase the level of integration.

Memory may utilize a large array of memory devices. Accordingly, reduction in the size of individual memory devices may translate into a large increase in the bit density. Common memory devices are dynamic random access memory (DRAM) devices, static random access memory (SRAM) devices, and nonvolatile devices (so-called flash devices). The nonvolatile devices may be incorporated into NAND or NOR memory array architectures.

The size of a memory device may be expressed in terms of the smallest feature size utilized in fabrication of the memory device. Specifically, if the smallest feature size is designated as "F", the memory device dimensions may be expressed in units of $F^2$. Conventional DRAM memory frequently comprises dimensions of at least $6F^2$, and SRAM may require even more semiconductor real estate.

A type of memory that potentially consumes very little semiconductor real estate is so-called cross-point memory. In cross-point memory, a memory cell occurs at overlap between a wordline and a bitline. Specifically, a material which undergoes a stable and detectable change upon exposure to current is provided between the wordline and bitline. The material may be, for example, a perovskite material, a chalcogenide material, an ionic transport material, a resistive switching material, a polymeric material and/or a phase change material. Since the memory cell may be confined to a region of overlap of a bitline and wordline, the memory cell may theoretically be formed to dimensions of $4F^2$ or less.

Problems encountered in closely packing cross-point memory may include disturbance mechanisms (or so-called cross-talk) occurring when data transfer to or from one memory cell influences a neighboring memory cell.

It is desired to develop improved methods for forming highly integrated circuitry, and to develop improved highly integrated circuit constructions.

BRIEF DESCRIPTION OF THE DRAWINGS

FIG. 1 is diagrammatic cross-sectional view of a portion of a construction in accordance with an embodiment.

FIG. 2 is diagrammatic cross-sectional view of a portion of a construction in accordance with an embodiment.

FIG. 3 shows three band-gap diagrams illustrating three different bias conditions of a diode in accordance with an embodiment.

FIG. 4 is diagrammatic cross-sectional view of a portion of a semiconductor construction in accordance with an embodiment. FIG. 4 also shows a schematic electrical diagram of some of the components of the cross-section.

FIG. 7 is a schematic electrical diagram of an array of memory elements in accordance with an embodiment.

FIG. 8 is diagrammatic cross-sectional view of a portion of a semiconductor construction in accordance with an embodiment.

FIG. 9 also shows a schematic electrical diagram of some of the components of the cross-section.

FIG. 10 also shows a schematic electrical diagram of some of the components of the cross-section.

DETAILED DESCRIPTION OF THE ILLUSTRATED EMBODIMENTS

Figure 5:
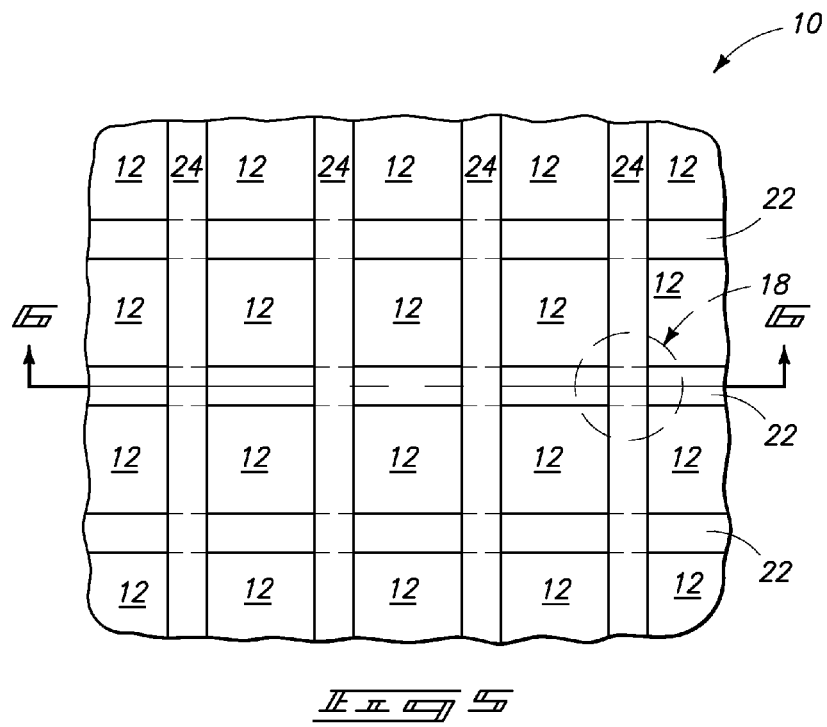
FIGS. 5 and 6 are a diagrammatic top view and a cross-sectional side view, respectively, of an array of cross-point memory cells in accordance with an embodiment. The cross-section of FIG. 6 is along the line 6-6 of FIG. 5. The portion of FIG. 4 is shown to be part of the portions of FIGS. 5 and 6; with the portion of FIG. 4 being within a dashed-line area designated as "4."

In some embodiments, cross-point memory cells are formed to include diodes. The diodes may be configured to enable current to pass to or from a portion of the memory cell, while also alleviating, and possibly preventing, cross-talk between adjacent devices. The diodes may contain stacked thin dielectric films, with the dielectric films being band-structure engineered to achieve tailored diode properties for particular memory cells.

It may be advantageous to utilize stacked dielectric materials for the diodes rather than utilizing conventional silicon-based n-p junction diodes. The conventional silicon-based junction diodes may be limited relative to bandgap, Shockley-Read-Hall (SRH) generation and recombination rates, active doping concentrations, injection velocity, carrier lifetime, and breakdown strength (or other high field properties such as ionization rates, etc.).

The cross-point memory cells may be arranged in vertical stacks. Stacking of the memory cells may substantially reduce the real estate consumption attributed to individual memory cells. For instance, if two $4F^2$ memory cells are stacked such that one is directly over the other, then the amount of semiconductor real estate consumed by each is effectively cut in half so that the individual memory cells are essentially only consuming $2F^2$ of semiconductor real estate. The reduction in effective real estate consumption increases proportionally to the number of vertically-stacked memory cells. Thus, significant strides in integration may be achieved by vertically stacking at least some of the memory cells of a memory cell array.

The stacked memory cells may be utilized as nonvolatile memory, and may correspond to single level cells (SLCs) or multilevel cells (MLCs). Such nonvolatile memory may be incorporated into NAND memory arrays. In embodiments in which multi-stacked multilevel cells (MS-MLCs) are formed, the memory may prove to be particularly low-cost, high-performance, and high-density. The stacked cells may be routed through multi-level interconnects.

In some embodiments, the fabrication of memory cells is conducted over a silicon substrate utilizing low-temperature deposition processes, and with few if any high temperature dopant activation steps. Avoidance of high-temperature processing may alleviate thermally-induced damage to integrated circuit devices. Also, many of the materials showing promise for utilization as memory elements in cross-point memory cells (for instance, $Ge_2Se_2Te_5$ and other chalcogenides, various metal oxides, etc.) lack high-temperature stability.

Example embodiments are described with reference to FIGS. 1-16.

Referring to FIG. 1, a fragment of a diode construction 2 is illustrated. The fragment comprises a base 12 and a diode 26 over base 12.

Base 12 may comprise semiconductor material, and in some embodiments may comprise, consist essentially of, or consist of monocrystalline silicon. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, it may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. In some embodiments, an uppermost region of the base may comprise an electrically insulative material so that a conductive layer of the memory unit 14 is directly against such insulative material. In some embodiments, base 12 may correspond to semiconductor-on-insulator (SOI).

Diode 26 comprises conductive materials 22 and 32 and insulative material 34. In some embodiments, conductive materials 22 and 32 may be referred to as conductive diode materials (or in other words, as diode electrodes). Conductive materials 22 and 32 may comprise any suitable composition or combination of compositions, and may, for example, comprise, consist essentially of, or consist of one or more of various metals (for instance, tantalum, platinum, tungsten, aluminum, copper, gold, nickel, titanium, molybdenum, etc.), metal-containing compositions (for instance, metal nitrides, metal silicides such as tungsten silicate or tantalum silicide, etc.), and conductively-doped semiconductor materials (for instance, conductively-doped silicon). Conductive materials 22 and 32 may each have a thickness of from about 2 nanometers to about 20 nanometers.

In some embodiments, material 22 may include one of aluminum, tungsten, molybdenum, platinum, nickel, tantalum, copper, titanium, tungsten silicide, or tantalum silicide and material 32 may include a different one of aluminum, tungsten, molybdenum, platinum, nickel, tantalum, copper, titanium, tungsten silicide, or tantalum silicide.

Insulative material 34 may be referred to as diode dielectric material, and may comprise any suitable composition or combination of compositions. As illustrated by FIG. 1, insulative material 34 may be in direct physical contact with both material 22 and material 34.

In some embodiments, insulative material 34 comprises a stack of electrically insulative layers, with the individual layers having band gap and/or band-alignment properties tailored for the particular application of the diode. The layers may have individual thicknesses of from about 0.7 nanometers to about 5 nanometers; and may comprise, consist essentially of, or consist of one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide. The oxide and nitrides are referred to in terms of the principal components, rather than in terms of specific stoichiometries. Accordingly, the oxide of silicon is referred to as silicon oxide, which encompasses the stoichiometry of silicon dioxide.

Material 34 may be configured to conduct current from material 32 to material 22 when a first voltage is applied across material 32 and material 22 with material 32 being at a higher potential than material 22. Material 34 may also be configured to inhibit current from flowing from material 22 to material 34 when a second voltage is applied across material 32 and material 22 with material 22 being at a higher potential than material 34. Accordingly, the second voltage may have a polarity opposite that of a polarity of the first voltage. In some embodiments, the first voltage may be between about 0.5 volts and 15 volts and the second voltage may be between about 0 volts and −15 volts. The first voltage may depend on a thickness of insulative material 34. The thicker insulative material 34 is, the larger the first voltage may be in order to maintain an electric field value E, which may be expressed as E=Voltage/thickness. Accordingly, diode 26 may be characterized as a selectively conducting device whose ability to conduct current depends on an applied bias voltage.

In some embodiments, the first voltage may have the same magnitude as the second voltage. Accordingly, diode 26 may allow current to flow from material 32 to material 22 when forward biased with a voltage but may inhibit current from flowing from material 22 to material 32 when reverse biased with the same voltage.

Tunneling properties of material 34, and/or carrier injection properties of conductive materials 22 and 32, may be tailored to engineer desired properties into the diode 26. For example, materials 22, 32, and 34 may be engineered so that diode 26 allows electrons to tunnel from material 22 through material 34 to material 32 when the first voltage described above is applied across material 32 and material 22 but inhibits electrons from tunneling from material 32 to material 22 when the second voltage described above is applied across material 32 and material 22.

Referring to FIG. 2, a fragment of a diode construction 4 is illustrated. Similar numbering is used in referring to FIG. 2 as is used above in describing FIG. 1 where appropriate. Fragment 4 depicts another embodiment of diode 26. Fragment 4 includes base 12 and diode 26 over base 12.

In the shown embodiment, diode dielectric material 34 comprises a stack of three different dielectric materials 54, 56, and 58. Such materials may be tailored relative to one another so that band gaps, and/or conduction band edges, and/or valence band edges, between the materials enable tunneling of carriers in one direction through the materials, but not in an opposing direction.

The dielectric materials 54, 56, and 58 may comprise any suitable materials, and may, for example, comprise one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide.

Although example diode 26 of FIG. 2 has three different dielectric materials (54, 56, and 58), in other embodiments the diode may comprise other than three different dielectric materials. Specifically, in some embodiments the diode may comprise more than three different dielectric materials, and in other embodiments the diode may comprise less than three different dielectric materials. The number of different dielectric materials used in the diode may affect the speed with which the diode reacts to a voltage. For example, as the number of different dielectric materials increases, a difference between a time when the diode is biased with a voltage and a time when current begins to flow through the diode responsive to the voltage may decrease. However, as the number of different dielectric materials increases, a magnitude of a voltage used to forward bias the diode may also increase.

The embodiment of FIG. 2 may be fabricated as follows. Initially, material 22 may be formed over base 12. Material 22 may be patterned by utilizing photolithographic processing and one or more etches. Subsequently, material 54 may be formed over material 22. In some embodiments, material 54 may be deposited on material 22 and may be patterned using photolithographic processing and one or more etches. Material 54 may be deposited with any suitable methodology, including, for example, atomic layer deposition (ALD). Materials 56 and 58 may subsequently be deposited over material 54 using one or more of the techniques described above in relation to material 54.

In some embodiments, the methods used in forming materials 54, 56, and 58 may be selected so that the methods do not substantially change the dimensions of material 22 or otherwise render material 22 inoperable as an electrode of diode 26. For example, a maximum temperature used in forming materials 54, 56, and 58 may be below a melting temperature of material 22 so that material 22 does not change dimension or shape as a result of the formation of materials 54, 56, and 58. By way of another example, materials 54, 56, and 58 may be undoped. Accordingly, annealing might not be used in forming materials 54, 56, and 58. Forming these materials without annealing may be advantageous because annealing may involve undesirably altering dimensions of material 22 due to high temperature.

Subsequently, material 32 may be formed over material 58. Material 32 may be patterned by utilizing photolithographic processing and one or more etches. Material 32 may be undoped and the formation of material 32 might not use a temperature higher than a melting temperature of material 22.

FIG. 3 shows band gap diagrams of diode 26 in an unbiased condition (diagram 60), a forward biased condition (diagram 62) and a reverse biased condition (diagram 64). Diagrams 60 and 64 show that in an unbiased condition, and in a reverse biased condition, bands from dielectric materials 58, 56 and 54 preclude migration of carriers between conductive materials 22 and 32. In contrast, diagram 62 shows that tunneling may occur in a forward biased condition so that carriers (specifically electrons in the shown embodiment) may tunnel from conductive material 22 to conductive material 32 via quantum wells 66. The flow of the electrons is diagrammatically illustrated with a dashed arrow 63 in FIG. 3. It is noted that the diodes shown in FIGS. 1 and 2 are oriented for current flow from conductive material 32 to conductive material 22. Such is consistent with the diagrams of FIG. 3 which illustrate electron flow from conductive material 22 to conductive material 32 (in other words, in an opposite direction to the current flow). In other embodiments, the arrangement of material 54, 56, and 58 may be reversed so that the electron flow in the forward-biased condition is from conductive material 32 to conductive material 22.

The band structures of FIG. 3 may be considered engineered band structures. Heterostructures may be formed by molecular beam epitaxy (MBE) growth of III/V materials. In dielectric materials, a band gap may be engineered through thermal treatments (such as thermal treatment of aluminum oxides), as is known for nonvolatile memory cells (such as "crested barrier" cells and VARIOT flash cells). The band gap engineered structures may exploit characteristics of band-edge discontinuities in carrier transport in the semiconductor, and/or may exploit characteristics of band-edge discontinuities in charge storage of the dielectric. For nonvolatile memory cells, this may enable optimization of retention, and endurance characteristics.

Deposition of thin layers of dielectric material may create local quantum wells 66 which may be exploited in the diode structures described herein. The conduction band and valence band edges of the dielectrics may be engineered by material choice and/or thermal treatments. Fermi-level pinning in the metal region may be engineered by tailoring the compositions of the conductive materials at the tops and bottoms of the diodes. The barrier heights along the dielectric thickness may determine the tunneling characteristics of the structures.

The diodes described in FIGS. 1 and 2 may be considered to be band-gap engineered in that compositions of materials 22, 32, 54, 56, and 58 are chosen so that the forward-biased tunneling of diagram 62 occurs. In choosing materials 22 and 32, work functions may be considered. A work function may be related to an amount of energy used to remove an electron from a metal. In FIG. 3, heights of the bars corresponding to materials 22 and 32 may represent work functions of materials 22 and 32. As illustrated in FIG. 3, material 22 may have a higher work function (represented by a higher bar) than material 32. Consequently, an amount of energy used to remove an electron from material 22 may be larger than an amount of energy used to remove an electron from material 32. Designing material 22 to have a higher work function than material 32 may help enable electrons to tunnel from material 22 through materials 58, 56, and 54 to material 32.

In choosing materials 54, 56, and 58, barrier heights may be considered. Barrier height may be related to a difference in electron affinity between two materials. In FIG. 3, heights of the bars corresponding to materials 54, 56, and 58 may represent barrier heights of materials 54, 56, and 58. In some embodiments, barrier heights of materials 54, 56, and 58 may be greater than work functions of materials 22 and 32 as is illustrated by diagram 60 of FIG. 3.

Band-gap engineering diode 26 may include selecting materials 54, 56, and 58 so that barrier heights of materials 54, 56, and 58 have a particular relationship. For example, each of materials 54, 56, and 58 may have a different barrier height. Further, as illustrated in diagram 60, materials 54, 56, and 58 may be arranged between materials 22 and 32 in order of increasing barrier height. Accordingly, material 54 (which is closest to material 22) may have the lowest barrier height of materials 54, 56, and 58, material 56 may have a barrier height larger than material 54, and material 58 may have a barrier height larger than material 56.

Materials 54, 56, and 58 may be chosen to have valence band energy levels that are aligned with respect to one another. By way of example, the valence band energy levels of materials 54, 56, and 58 may be aligned if the valence band energy levels of materials 54, 56, and 58 are substantially the same. Alternatively, materials 54, 56, and 58 may be chosen to have conduction band energy levels that are aligned with respect to one another. By way of example, the conduction band energy levels of materials 54, 56, and 58 may be aligned if the conduction band energy levels of materials 54, 56, and 58 are substantially the same.

Materials 54, 56, and 58 may be selected so that quantum wells 66 are created at the junction between material 54 and material 56 and at the junction between material 56 and 58 when diode 26 is forward biased. As was described above, diode 26 may be forward biased by a voltage applied across materials 32 and 22 so that material 32 is at a higher potential than material 22. Furthermore, in a forward biased condition, quantum wells might form between conductive materials at the tops and bottoms of the diodes (with such conductive materials being the electrodes of the diodes).

The quantum wells will have discrete energy levels. The contact between one electrode and an adjacent dielectric will have a first Fermi level. When energy is provided the state may be raised to a first allowed quantum energy level, which may dramatically increase the probability of carrier tunneling. This may lead to an effective lowering of the potential barrier in the dielectric.

In a reverse bias condition (such as the condition depicted by diagram 64), the potential barrier is high and formation of any quantum well is suppressed. There is, therefore, a low probability for conduction current to flow from one metal to another—due to reduced tunneling, which approaches zero—if the dielectric thickness is appropriately tailored.

Tunneling characteristics across structures such as diode 26 indicate that there may be a sharp turn-on characteristic when the Fermi level corresponds to a lowest allowed quantum energy level. The results may be modified in the presence of phonons at higher temperatures, but a non-linear characteristic may result from such structure.

Tunneling may be a very fast process, and may occur in femtoseconds. Tunneling may also be relatively independent of temperature. Accordingly, thin film diodes of the type described herein may be able to be switched very fast, and to meet high temperature reliability criteria. For example, diode 26 may be forward biased and current may flow through diode 26. Diode 26 may subsequently be reverse biased so that current is inhibited from flowing through diode 26. Diode 26 may be repeatedly forward biased and then reverse biased in this manner at a high rate. In some embodiment, the rate may exceed 10 GHz.

Some example compositions suitable for the band-gap engineered diodes are aluminum for material 22, aluminum oxide for material 58, silicon dioxide for material 56, silicon nitride for material 54, and tungsten for material 32. Another set of exemplary compositions is molybdenum for material 22, silicon dioxide for material 58, silicon nitride for material 56, hafnium oxide for material 54 and platinum for material 32. Another set of exemplary compositions is platinum for material 22, silicon dioxide for material 58, hafnium oxide for material 56, zirconium oxide for material 54 and nickel for material 32.

Referring to FIG. 4, a fragment of a semiconductor construction 10 is illustrated. The fragment comprises a base 12 and a plurality of cross-point memory units 14, 16 and 18 over the base. Adjacent memory units are spaced from one another by passivation material 20.

A schematic electrical diagram 30 is shown adjacent fragment 10 to illustrate some of the electrical components of the fragment. The electrical diagram shows that the memory units 14, 16 and 18 individually comprise a wordline 22, a bitline 24, a diode 26 and a memory element 28.

The wordlines and bitlines 22 and 24 are shown in semiconductor construction 10 to comprise electrically conductive material. Such electrically conductive material may comprise any suitable composition or combination of compositions, including one or more of various metals (for instance, tantalum, platinum, tungsten, aluminum, copper, gold, etc.), metal-containing compositions (for instance, metal nitrides, metal silicides, etc.), and conductively-doped semiconductor materials (for instance, conductively-doped silicon). The individual wordlines and bitlines may have thicknesses of from about 2 nanometers to about 20 nanometers.

The memory elements 28 may comprise any suitable composition or combination of compositions, and may, for example, comprise, consist essentially of, or consist of one or more of perovskite materials, chalcogenide materials, ionic transport materials, resistive switching materials, polymeric materials and phase change materials.

The memory elements 28, conductive material 32, and bitlines 24 together form memory components 35. Current within one or both of the conductive materials 32 and 24 of the memory components 35 may be utilized to change a state of memory element 28 in a writing operation, or to ascertain a state of the memory element 28 in a reading operation.

The conductive material 32, insulative material 34, and wordlines 22 together form diodes 26 as was described in detail above in relation to FIGS. 1-3. The conductive material 32 is overlapped by the memory components 35 and the diodes 26. In some embodiments, the conductive material 32 may be referred to as conductive diode material (or in other words, as a diode electrode), even though material 32 is also part of the memory components.

The diodes are shown between the wordlines and the memory elements. In other embodiments, the diodes may be additionally, or alternatively, provided between the bitlines and the memory elements.

In the shown embodiment, the rectifying diodes permit current flow from the memory elements to the wordlines, but restrict current flow in the opposing direction. Such can enable reading to and writing from individual memory elements, while limiting cross-talk between adjacent memory elements. The cross-talk is further restricted by the provision of passivation material 20 between the adjacent memory units. The passivation material may comprise any suitable composition or combination of compositions, and may, for example, comprise, consist essentially of, or consist of one or more of silicon dioxide, silicon nitride, silicon oxynitride, and organic material (for instance, polyimide, amorphous carbon, photoresist, etc.).

Although the diodes are shown oriented to direct current flow from the memory elements to the wordlines, in other embodiments the orientation of the diodes may be reversed. Accordingly, the diodes may be oriented to permit current flow from the wordlines to the memory elements, and to restrict current flow in the opposing direction. Such configuration may also enable reading to and writing from individual memory elements, while limiting cross-talk between adjacent memory elements.

Figure 6:
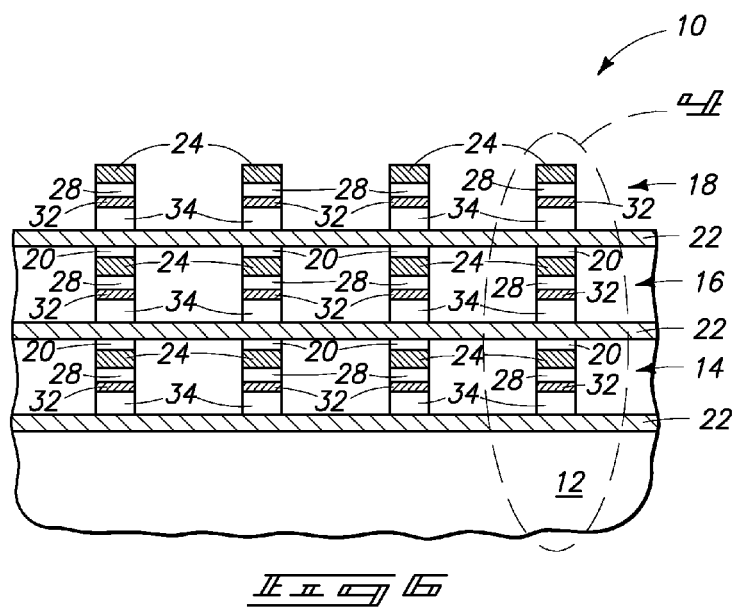

The memory units may be incorporated into an array comprising both vertical stacking of memory units and horizontal arrangement of the units, as shown in FIGS. 5 and 6.

FIGS. 5 and 6 show the portion of FIG. 4 as part of a larger portion of construction 10. The memory units 14, 16, and 18 are labeled in the cross-section of FIG. 6, and are shown to be part of an array comprising a plurality of identical columns of memory units.

The bitlines 24 are shown to extend substantially orthogonally to the wordlines 22. The term "substantially orthogonally" means that the bitlines and wordlines are more orthogonal to one another than not, which can include, but is not limited to, embodiments in which the wordlines and bitlines are entirely exactly orthogonal to one another.

The bitlines 24 are shown to be vertically interlaced with the wordlines, with individual bitlines being paired with individual wordlines in the memory units. The vertical interlacing of the bitlines and wordlines more specifically comprises individual bitlines interjacent pairs of wordlines, and individual wordlines interjacent pairs of bitlines. In other words, the wordlines and bitlines alternate with one another throughout the vertical stacks.

The embodiment of FIGS. 5 and 6 may be fabricated as follows.

Initially, a first level of wordlines is formed over a semiconductor base (or substrate) 12. The first level of wordlines may be patterned by utilizing photolithographic processing and one or more etches to pattern wordline material into a plurality of lines.

Subsequently, a first level of diode dielectric material 34 (which may be a stack of multiple dielectric layers) is formed over the first level of wordlines. The diode dielectric material may be deposited across the wordlines and spaces between the wordlines, and then patterned utilizing photolithographic processing and one or more etches to create the shown configuration in which the diode dielectric material is only at cross-points of the wordlines and bitlines. In some embodiments, the diode dielectric material may be left between the wordlines rather than patterned to be only at cross-points of the wordlines and bitlines. The diode dielectric may be deposited with any suitable methodology, including, for example, ALD.

A first level of electrically conductive diode material (i.e., a diode electrode) 32 is then formed over the diode dielectric material. The electrically conductive material 32 may be formed in the shown configuration by depositing the material and then patterning it with a photolithographic ally patterned mask and one or more etches.

A first level of memory elements 28 is formed over the first level of conductive diode material. The memory elements may be formed by depositing memory element material across the wordlines and spaces between the wordlines, and then patterning the memory element material utilizing photolithographic processing and one or more etches to create the shown configuration in which the memory element material is only at cross-points of the wordlines and bitlines. In some embodiments, the memory element material may be left between the wordlines rather than patterned to be only at cross-points of the wordlines and bitlines.

A first level of bitline material is formed over the first level of memory elements. The bitline material may be deposited across the wordlines and spaces between the wordlines, and then patterned utilizing photolithographic processing and one or more etches to create the shown configuration in which the bitlines are substantially orthogonal to the wordlines.

Subsequent levels of wordlines, diode dielectric, conductive diode material, memory elements and bitlines may be formed using subsequent iterations of the above-discussed processing to form vertically-stacked memory arrays to desired heights. In some embodiments, the vertical stacks may comprise at least 3 memory units, at least 10 memory units, or at least 15 memory units.

The vertically-stacked memory units may be identical to one another, or may differ from one another. For instance, the diode material utilized for memory units at one level of a vertical stack may be different in composition from the diode material utilized for memory units at another level of a vertical stack; or may be the same composition as the diode material utilized for the memory units at the other level of the vertical stack.

The configuration of FIGS. 5 and 6 has the diodes provided between the wordlines and the memory elements. In other configurations, the diodes may be provided between the memory elements and the bitlines. The fabrication process utilized to form such other configurations may be similar to that utilized to form the configuration of FIGS. 5 and 6, except that the conductive diode material and diode dielectric material will be formed after formation of the memory elements rather than before formation of the memory elements. In yet other embodiments, the orientation of the wordlines and bitlines in the memory units may be reversed (so that the bitlines are under the wordlines) and the diodes may be formed either between the wordlines and the memory elements, or between the bitlines and the memory elements.

FIG. 7 is a schematic circuit diagram of one level of the embodiment of FIGS. 5 and 6. FIG. 7 shows the memory elements 28 and diodes 26 between wordlines 22 and bitlines 24, and further shows the diodes connected between the memory elements and the wordlines.

FIG. 8 shows an example cross-point memory cell 50 illustrating an embodiment of a diode that may be utilized. Similar numbering will be used in referring to FIG. 8 as is utilized above in describing FIGS. 1-7, where appropriate.

The cross-point memory cell is formed over a semiconductor base 12. The memory cell comprises a wordline 22, diode dielectric material 34, electrically conductive diode material 32, a memory element 28 and a bitline 24.

The conductive diode material 32, memory element 28, and bitline 24 together form a memory component 52. Current within one or both of the conductive materials 32 and 24 of the memory component may be utilized to change a state of memory element 28 in a writing operation, or to ascertain a state of the memory element 28 in a reading operation.

The wordline 22, diode dielectric material 34, and electrically conductive diode material 32 together form a diode 26. The electrically conductive materials 22 and 32, and diode dielectric material 34, may be tailored to impart desired properties to the diode.

In the shown embodiment, the diode dielectric material 34 comprises a stack of three different dielectric materials 54, 56, and 58. Such materials may be tailored relative to one another so that band gaps, and/or conduction band edges, and/or valence band edges, between the materials enable tunneling of carriers in one direction through the materials, but not in an opposing direction as was described above in relation to FIGS. 1-3.

Figure 9:
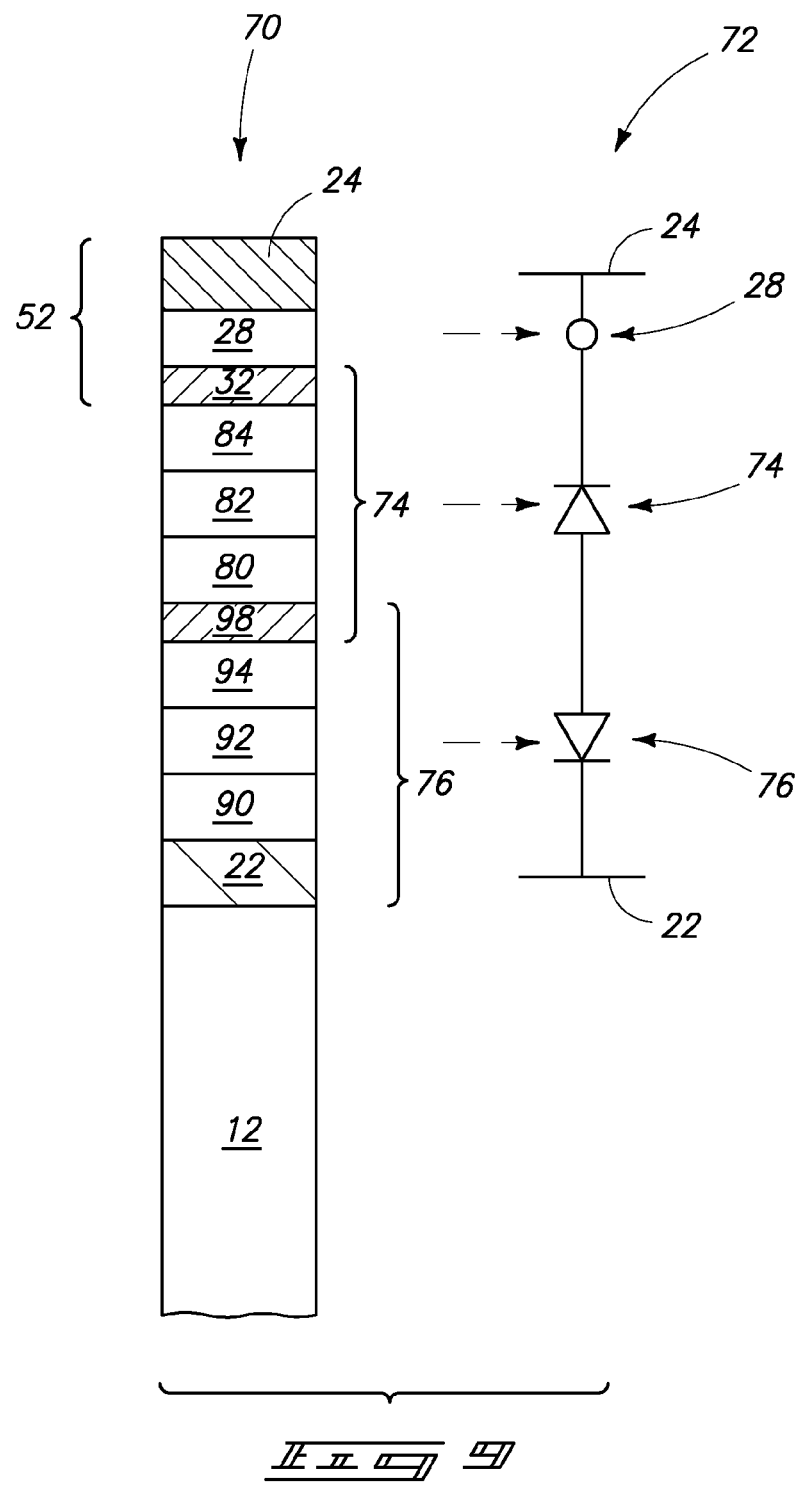
FIG. 9 is diagrammatic cross-sectional view of a portion of a semiconductor construction in accordance with an embodiment.

The memory cells of FIGS. 4-8 have a single diode in each memory unit cell. In other embodiments, multiple diodes may be utilized in a single memory unit cell. For instance, a pair of diodes may be provided in back-to-back arrangement to provide silicon controlled rectifier (SCR) type properties. FIG. 9 illustrates a memory unit cell comprising a back-to-back diode arrangement. In referring to FIG. 9, similar numbering will be used as is used above in describing FIGS. 1-8, where appropriate.

FIG. 9 shows a portion 70 of a semiconductor construction, and shows a schematic electrical diagram 72 adjacent the portion 70 to illustrate electrical components comprised by the portion 70. The schematic electrical diagram 72 shows that the portion comprises a wordline 22, a bitline 24, a memory element 28, a first diode 74, and a second diode 76. The first and second diodes are adjacent one another, and in back-to-back orientation relative to one another.

The portion 70 comprises base 12, memory component 52 (containing bitline 24, memory element 28, and conductive material 32), and the diodes 74 and 76 between the memory component and the wordline. The diode 74 comprises diode dielectric materials 80, 82, and 84; and the diode 76 comprises diode dielectric materials 90, 92, and 94. Dielectric materials 80, 82, 84, 90, 92, and 94 may comprise any of the compositions discussed above for diode dielectric materials.

A conductive material 98 is between the diodes, and bridges the diodes with one another. The conductive material may comprise any suitable composition, and may, for example, comprise one or more metals (for instance, one or more of tantalum, platinum, tungsten, aluminum, copper, and gold) and/or one or more metal-containing compositions (for instance, metal silicide or metal nitride).

Figure 10:
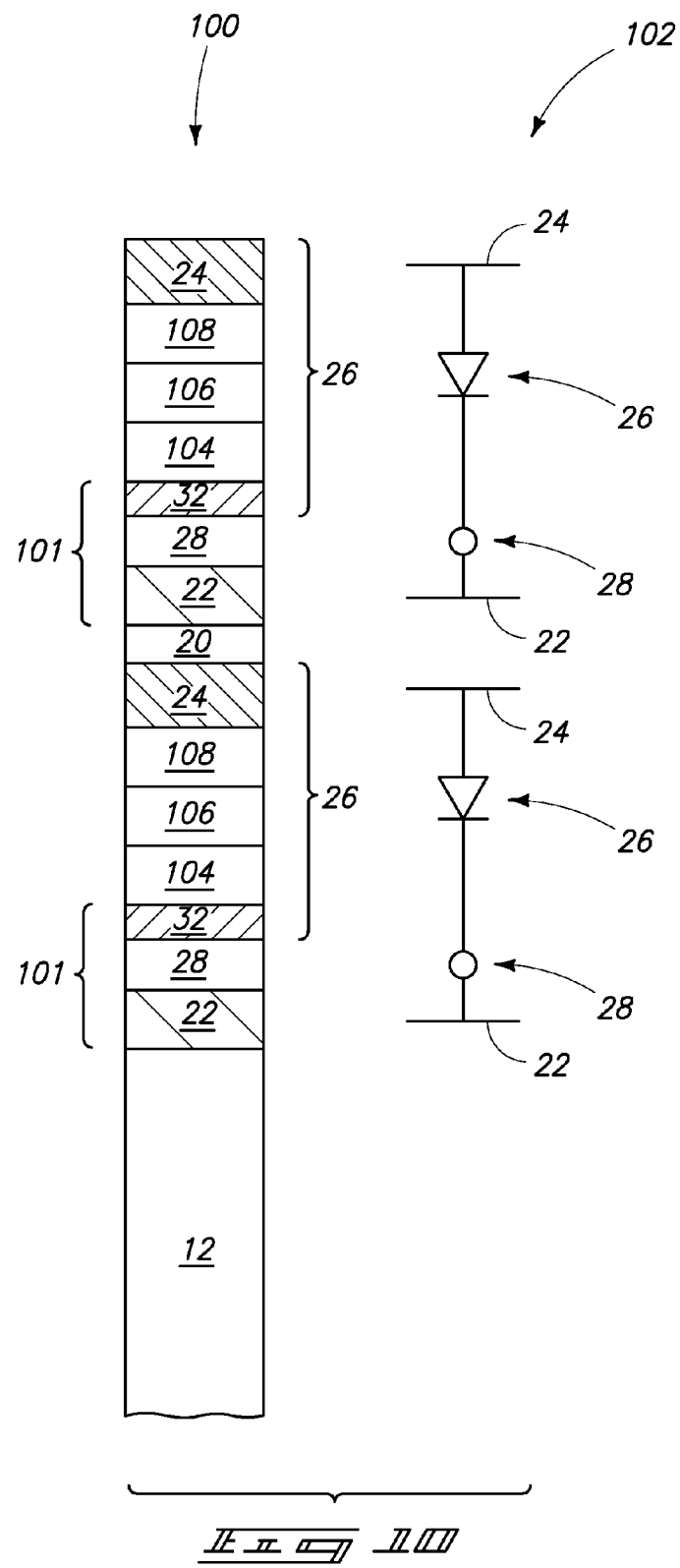
FIG. 10 is diagrammatic cross-sectional view of a portion of a semiconductor construction in accordance with an embodiment.

The embodiments of FIGS. 4-9 specifically show diodes provided between wordlines and memory elements. As discussed above, the diodes may be additionally, or alternatively, provided between the bitlines and the memory elements. FIG. 10 illustrates an embodiment in which vertically-stacked memory cells have diodes provided between bitlines and memory elements. Similar numbering will be used to describe FIG. 10 as is utilized in describing FIGS. 1-9, where appropriate.

FIG. 10 shows a portion 100 of a semiconductor construction, and shows a schematic electrical diagram 102 adjacent the portion 100 to illustrate electrical components comprised by the portion 100. The schematic electrical diagram 102 shows that the portion comprises wordlines 22, bitlines 24, memory elements 28, and diodes 26.

The portion 100 comprises base 12, memory components 101 (containing wordlines 22, memory elements 28, and conductive material 32), diodes 26, and passivation 20 between adjacent memory cells. The diodes 26 comprise diode dielectric materials 104, 106, and 108. Dielectric materials 104, 106, and 108 may comprise any of the compositions discussed above for diode dielectric materials.

The memory cells discussed with reference to FIGS. 1-10 may have numerous advantages associated therewith. For instance, the diodes may be able to exploit Fermi-level pinning between metal and dielectric to modulate turn-on characteristics. Additionally, the diodes of the memory units may be utilized in back-to-back tunneling arrangements for SCR-type characteristics. Also, band-gap engineered diodes may be utilized on insulators to provide a device structure for cross-point memory cells to reduce cell-to-cell disturbances. In some embodiments, trenched isolation (for instance, shallow trench isolation) may be omitted from a memory array, and oxide may be deposited on flat surfaces as passivation to isolate stacked memory cells from one another. Further, multiple diodes may be configured to provide appropriate current densities to a contact metal for programming efficiency. In some embodiments, silicates may be included in a dielectric stack to increase the density of tunneling states.

Figure 11:
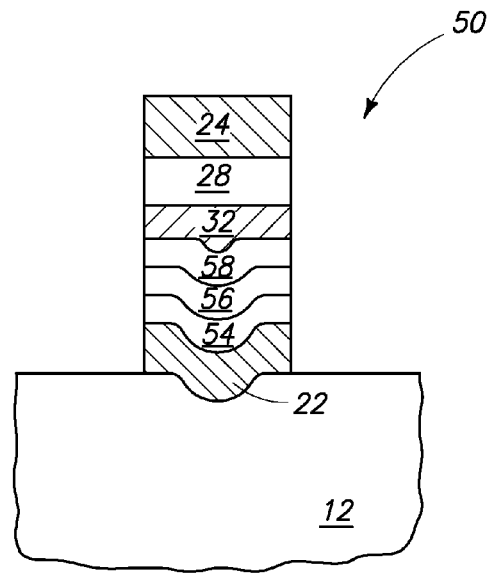
FIG. 11 is diagrammatic cross-sectional view of a portion of a semiconductor construction in accordance with an embodiment.

The memory cells discussed above have planar electrodes. In other embodiments, at least the bottom electrode may be non-planar. The non-planarity of the bottom electrode may increase injection efficiency by increasing the surface area of the bottom electrode. FIG. 11 shows an example cross-point memory cell illustrating an embodiment having a non-planar bottom electrode. The same numbering will be used in referring to FIG. 11 as is utilized above in describing FIG. 8.

The cross-point memory cell 50 of FIG. 11 is formed over a semiconductor base 12. The memory cell comprises the wordline 22, diode dielectric materials 54, 56, and 58, electrically conductive diode material 32, memory element 28, and bitline 24 that were described above with reference to FIG. 8. The bottom electrode 22 of FIG. 11 (in other words, the wordline) is partially recessed into base 12 in the shown embodiment. The bottom electrode may be totally recessed into the base in some embodiments. The portion of the base that the bottom electrode extends into may be any suitable material, and may, for example, be an insulative material such as silicon dioxide, silicon nitride, borophosphosilicate glass, etc.

Figure 12:
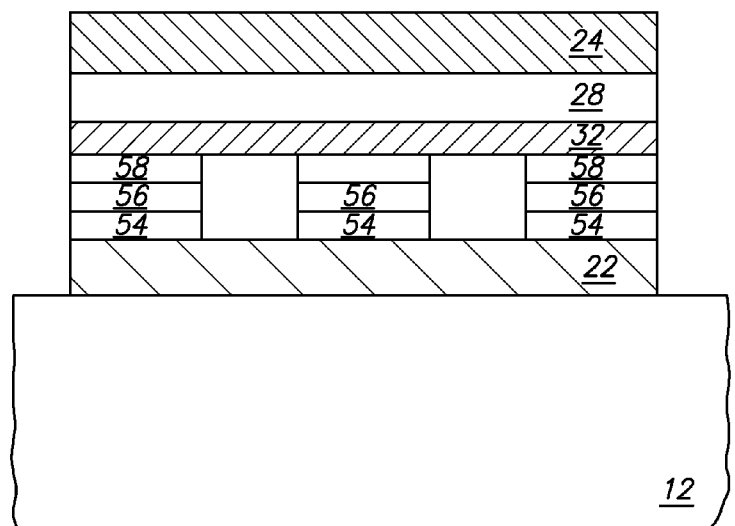
FIG. 12 is diagrammatic cross-sectional view of a portion of a semiconductor construction in accordance with an embodiment.

In some embodiments, multiple diodes may be utilized to achieve desired current density. FIG. 12 shows an example cross-point memory cell illustrating an embodiment having a multiple diodes. The same numbering will be used in referring to FIG. 12 as is utilized above in describing FIG. 8.

The cross-point memory cell 50 of FIG. 12 is formed over a semiconductor base 12. The memory cell comprises the wordline 22, diode dielectric materials 54, 56, and 58, electrically conductive diode material 32, memory element 28, and bitline 24 that were described above with reference to FIG. 8. The diode dielectric materials form three separate parallel diode interconnects between the wordline and the material 32.

The memory cells discussed with reference to FIGS. 4-12 may be utilized in electronic systems, such as computers, etc. In some embodiments, the memory cells may be utilized as non-volatile memory cells and incorporated into flash memory. In some embodiments, the flash memory may be fabricated into flash memory cards.

Figure 13:
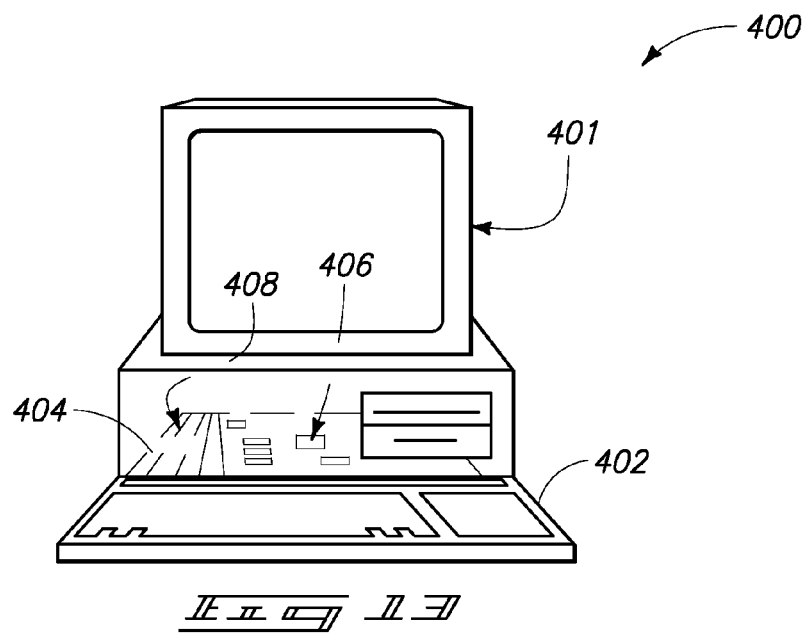
FIG. 13 is a diagrammatic view of a computer embodiment.
Figure 14:
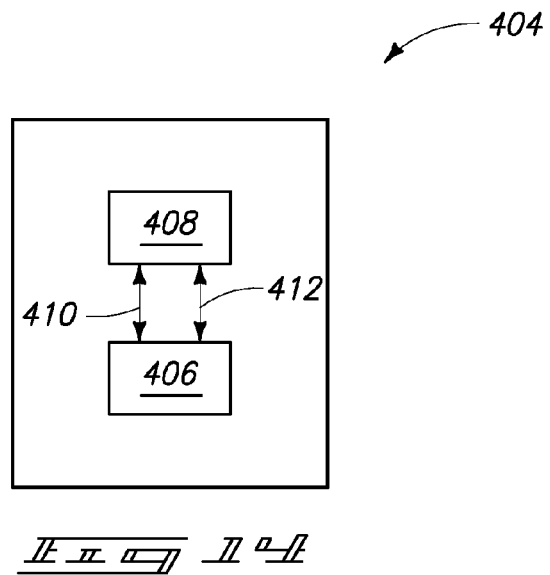
FIG. 14 is a block diagram showing particular features of the motherboard of the FIG. 13 computer embodiment.

FIG. 13 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 14. In such block diagram, the addressing circuitry is illustrated as 410 and the read circuitry is illustrated as 412.

Processor device 406 may correspond to a processor module, and associated memory utilized with the module may comprise any of the memory structures discussed with reference to FIGS. 4-12.

Memory device 408 may correspond to a memory module, and may comprise any of the memory structures discussed with reference to FIGS. 4-12.

Figure 15:
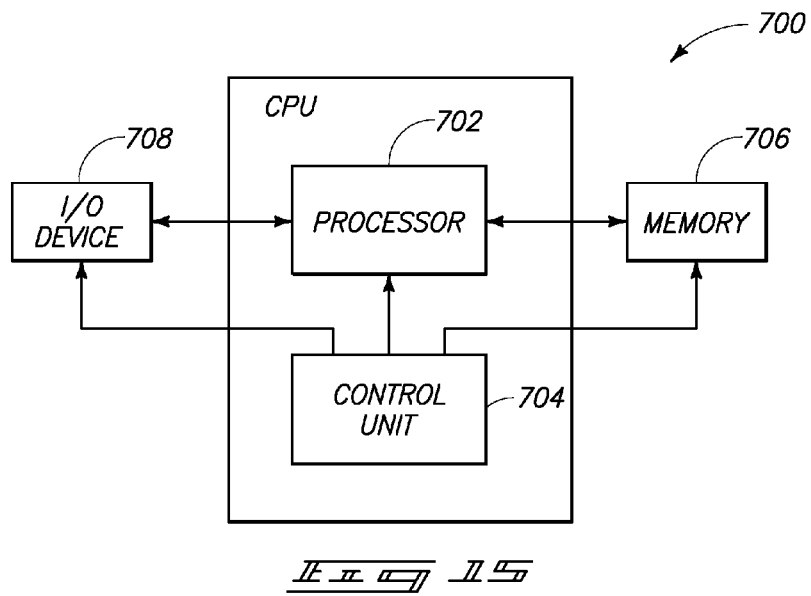
FIG. 15 is a high-level block diagram of an electronic system embodiment.

FIG. 15 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706, and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706, and the I/O device 708 by continuously cycling through a set of operations that cause instructions to be fetched from the memory device 706 and executed. The memory device 706 may include any of the memory structures discussed with reference to FIGS. 4-12.

Figure 16:
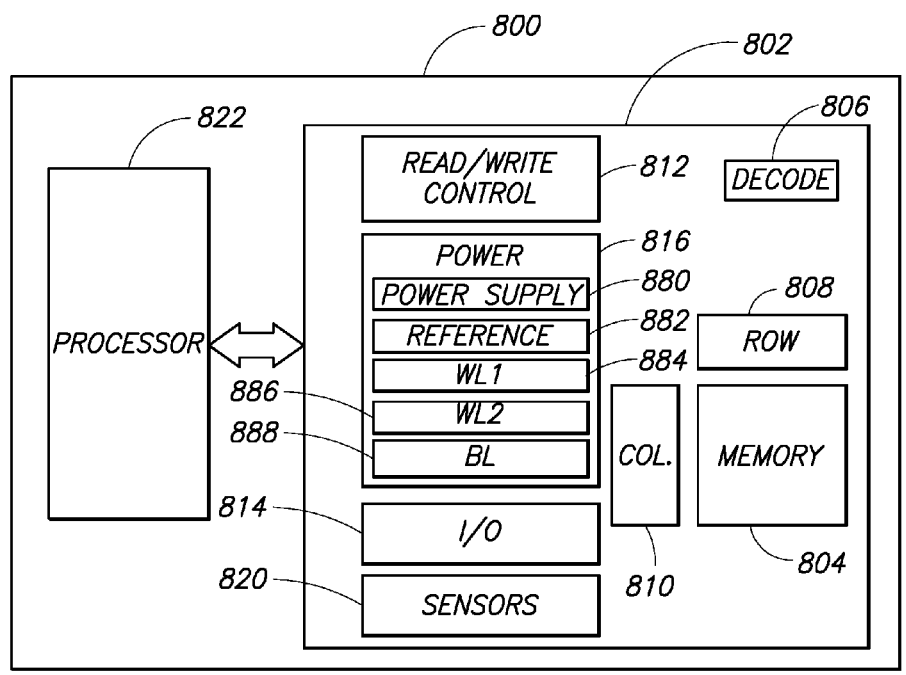
FIG. 16 is a simplified block diagram of an electronic system embodiment.

FIG. 16 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data, which is accessed via I/O lines. At least one of the processor 822 or memory device 802 may include any of the memory structures discussed with reference to FIGS. 4-12.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A selectively conducting device comprising:
    a first electrode comprising a first metal-comprising material having a first work function;
    a second electrode comprising a second metal comprising material comprising a second work function, the first and second work functions being non-equivalent; and
    a plurality of at least three stacked un-doped dielectric materials between the first and second electrodes being configured to conduct current from the first electrode to the second electrode when a first voltage is applied across the first electrode and the second electrode and being configured to inhibit current from flowing from the second electrode to the first electrode when a second voltage having a polarity opposite that of a polarity of the first voltage is applied across the first electrode and the second electrode, each of the plurality of at least three stacked un-doped dielectric materials having a barrier height that is higher than the first and the second work functions, the plurality of at least three stacked un-doped dielectric materials having a barrier height greater than both a work function of the first metal and a work function of the second metal, the plurality of at least three stacked un-doped dielectric materials being physically arranged between the first electrode and the second electrode in order of increasing barrier height, a first dielectric material of the plurality of at least three stacked un-doped dielectric materials nearest the second electrode having the lowest barrier height of the plurality of at least three stacked un-doped dielectric materials and a second material of the plurality of at least three stacked un-doped dielectric materials nearest the first electrode having the highest barrier height of the plurality of at least three stacked un-doped dielectric materials.

2. The device of claim 1 wherein the first electrode comprises a first metal and the second electrode comprises a second metal different than the first metal.

3. The device of claim 2 wherein the first metal is one of aluminum, tungsten, molybdenum, platinum, nickel, tantalum, copper, titanium, tungsten silicide, or tantalum silicide and the second metal is a different one of aluminum, tungsten, molybdenum, platinum, nickel, tantalum, copper, titanium, tungsten silicide, or tantalum silicide.

4. The device of claim 1 wherein each material of the plurality of at least three stacked un-doped dielectric materials comprises a different dielectric material.

5. The device of claim 4 wherein each material of the plurality of at least three stacked un-doped dielectric materials has a different barrier height, each barrier height being related to an energy difference between a conduction band and a valence band of one of the layers of the plurality of at least three stacked un-doped dielectric materials.

6. The device of claim 4 wherein each dielectric material of the plurality of at least three stacked un-doped dielectric materials has a valence band energy level and the valence band energy levels of the dielectric materials of the plurality of at least three stacked un-doped dielectric materials are aligned.

7. The device of claim 4 wherein each dielectric material of the plurality of at least three stacked un-doped dielectric materials has a conduction band energy level and the conduction band energy levels of the dielectric materials of the plurality of at least three stacked un-doped dielectric materials are aligned.

8. A selectively conducting device comprising:
    a first electrode comprising a first material having a first work function;
    a second electrode comprising a second material having a second work function, the first and second work functions being non-equivalent;
    a plurality of at least three un-doped dielectric material layers in physical contact with the first and second electrodes, each of the plurality of at least three un-doped dielectric material layers having a barrier height that is higher than the first and second work functions, the plurality of at least three un-doped dielectric material layers being physically arranged between the first electrode and the second electrode in order of increasing barrier height, a layer of the plurality of at least three un-doped dielectric materials nearest the second electrode having the lowest barrier height of the plurality of at least three un-doped dielectric materials and a layer of the plurality of at least three un-doped dielectric materials nearest the first electrode having the highest barrier height of the plurality of at least three un-doped dielectric material layers; and wherein the device is configured to allow electrons to tunnel from the second electrode through the dielectric materials to the first electrode when a first voltage is applied across the first electrode and the second electrode and to inhibit electrons from tunneling from the first electrode through the plurality of at least three un-doped dielectric material layers to the second electrode when a second voltage having a polarity opposite that of a polarity of the first voltage is applied across the first electrode and the second electrode.

9. The device of claim 8 wherein the first electrode comprises one of aluminum, tungsten, molybdenum, platinum, nickel, tantalum, copper, titanium, tungsten silicide, or tantalum silicide and the second electrode comprises a different one of aluminum, tungsten, molybdenum, platinum, nickel, tantalum, copper, titanium, tungsten silicide, or tantalum silicide.

10. The device of claim 8 wherein each layer of the plurality of at least three un-doped dielectric material layers has a valence band energy level and the valence band energy levels of the layers of the plurality of at least three un-doped dielectric material layers are aligned.

11. The device of claim 8 wherein the first electrode, second electrode, and dielectric materials are undoped.

12. A diode construction comprising:
a substrate;
a second metal layer over the substrate and comprising a first material having a first work function;
a plurality of at least three layers of un-doped dielectric material over the second metal layer;
a first metal layer over the dielectric material and comprising a second material having a second work function that differs from the first work function; and
wherein the plurality of at least three layers of un-doped dielectric material is configured to allow electrons to tunnel from the second metal layer to the first metal layer when a first voltage is applied across the first metal layer and the second metal layer and to inhibit electrons from tunneling from the first metal layer to the second metal layer when a second voltage having a polarity opposite that of a polarity of the first voltage is applied across the first metal layer and the second metal layer, each layer of the plurality of at least three layers of un-doped dielectric material having a barrier height that is higher than the first and second work functions, the plurality of at least three layers of un-doped dielectric material comprising at least three different dielectric materials arranged in order of increasing barrier height, a layer of the plurality of at least three layers of un-doped dielectric material nearest the second electrode having the lowest barrier height of the plurality and a layer of the plurality of at least three layers of un-doped dielectric material nearest the first metal layer having the highest barrier height of the plurality of at least three layers of un-doped dielectric material.

13. The construction of claim 12 wherein the plurality of at least three layers of un-doped dielectric material is in direct physical contact with both the first metal layer and the second metal layer.

14. The construction of claim 12 wherein each layer of the plurality of at least three layers of un-doped dielectric material has a thickness less than or equal to 6 nanometers.

15. A diode forming method comprising:
forming a second metal layer over a substrate, the second metal layer comprising a material having a first work function;
forming a plurality of at least three layers of un-doped dielectric materials over the second metal layer;
forming a first metal layer over the dielectric material, the first metal layer having a second work function that differs from the first work function, each of the plurality of at least three layers of un-doped dielectric materials having a barrier height that is higher than the first and second work functions; and
wherein the plurality of at least three layers of un-doped dielectric material comprises at least three different dielectric materials arranged in order of increasing barrier height, a layer of the plurality of at least three layers of un-doped dielectric material nearest the second electrode having the lowest barrier height of the plurality and a layer of the plurality of at least three layers of un-doped dielectric material nearest the first metal layer having the highest barrier height of the plurality of at least three layers of un-doped dielectric material.

16. The method of claim 15 wherein the forming the plurality of at least three layers of un-doped dielectric materials comprises depositing the dielectric material on the second metal layer using atomic layer deposition.

17. The method of claim 15 wherein a maximum temperature used in the forming of the dielectric materials is below a melting temperature of the second metal layer.

18. A current modulation method comprising:
enabling a current to flow through a diode;
subsequent to the enabling, inhibiting the current from flowing through the diode;
repeating the enabling and the inhibiting at a rate;
wherein the diode comprises a first electrode having a first work function, a second electrode having a second work function that differs from the first work function, and a plurality of at least three layers of un-doped dielectric materials each having a barrier height that is higher than the first and second work functions configured to conduct current from the first electrode to the second electrode when a first voltage is applied across the first electrode and the second electrode and to inhibit current from flowing from the second electrode to the first electrode when a second voltage having a polarity opposite that of a polarity of the first voltage is applied across the first electrode and the second electrode, the plurality of at least three layers of un-doped dielectric material comprising at least three different dielectric materials arranged in order of increasing barrier height, a layer of the plurality of at least three layers of un-doped dielectric material nearest the second electrode having the lowest barrier height of the plurality and a layer of the plurality of at least three layers of un-doped dielectric material nearest the first metal layer having the highest barrier height of the plurality of at least three layers of un-doped dielectric material.

19. The method of claim 18 wherein the rate is greater than 10 GHz.

* * * * *